United States Patent
Tatiyosyan

(10) Patent No.: US 10,236,813 B2
(45) Date of Patent: Mar. 19, 2019

(54) METHOD AND DEVICE FOR DETECTING A CONTROL METHOD OF AN INVERTER

(71) Applicant: Robert Bosch GmbH, Stuttgart (DE)

(72) Inventor: Sevan Tatiyosyan, Sersheim (DE)

(73) Assignee: Robert Bosch GmbH, Stuttgart (DE)

( * ) Notice: Subject to any disclaimer, the term of this patent is extended or adjusted under 35 U.S.C. 154(b) by 8 days.

(21) Appl. No.: 15/554,598

(22) PCT Filed: Jan. 22, 2016

(86) PCT No.: PCT/EP2016/051294
§ 371 (c)(1),
(2) Date: Aug. 30, 2017

(87) PCT Pub. No.: WO2016/139010
PCT Pub. Date: Sep. 9, 2016

(65) Prior Publication Data
US 2018/0019692 A1    Jan. 18, 2018

(30) Foreign Application Priority Data

Mar. 4, 2015   (DE) .................. 10 2015 203 816

(51) Int. Cl.
*H02P 27/08* (2006.01)
*G01R 31/34* (2006.01)
(Continued)

(52) U.S. Cl.
CPC .............. *H02P 21/20* (2016.02); *G01R 19/17* (2013.01); *G01R 23/155* (2013.01);
(Continued)

(58) Field of Classification Search
CPC ......... H02P 21/20; H02P 21/22; G01R 19/17; G01R 23/155; G01R 31/343
See application file for complete search history.

(56) References Cited

U.S. PATENT DOCUMENTS

2008/0258673 A1   10/2008  Welchko et al.
2009/0115362 A1*  5/2009   Saha .................. B60L 11/123
                                              318/400.09
(Continued)

FOREIGN PATENT DOCUMENTS

DE      102011081215       2/2013

OTHER PUBLICATIONS

International Search Report for Application No. PCT/EP2016/051294 dated May 3, 2016 (English Translation, 2 pages).

*Primary Examiner* — Walter L Lindsay, Jr.
*Assistant Examiner* — Milton Gonzalez
(74) *Attorney, Agent, or Firm* — Michael Best & Friedrich LLP

(57) ABSTRACT

The invention relates to a method for detecting a control method of an inverter (11) for supplying current to an electric machine (1), in particular a synchronous machine, having N phases. The method comprises sensing a control signal (CU, DU, CV, DV, CW, DW), which is fed to the inverter and which is clocked with a periodic cycle, over a specified number of periodic cycles of the control signal; determining a duty cycle frequency for the sensed control signal over the specified number of periodic cycles; and detecting the control method on the basis of the determined duty cycle frequency. The invention further relates to a device (5) designed to perform the method. In addition, the invention further relates a use of the method or of the device to monitor a torque of the electric machine and in particular to estimate an operating-point-dependent power loss of the electric machine according to the detected control method.

10 Claims, 3 Drawing Sheets

(51) Int. Cl.
| | |
|---|---|
| *H02P 21/20* | (2016.01) |
| *G01R 19/17* | (2006.01) |
| *H02P 21/22* | (2016.01) |
| *G01R 23/15* | (2006.01) |
| *G01R 31/44* | (2006.01) |
| *H03K 9/08* | (2006.01) |

(52) U.S. Cl.
CPC ............ *G01R 31/343* (2013.01); *G01R 31/44* (2013.01); *H02P 21/22* (2016.02); *H02P 27/08* (2013.01); *H03K 9/08* (2013.01)

(56) References Cited

U.S. PATENT DOCUMENTS

| | | | |
|---|---|---|---|
| 2013/0187708 A1 | 7/2013 | Dang et al. | |
| 2013/0250636 A1* | 9/2013 | Arimura | H02M 7/797 363/78 |
| 2014/0042948 A1* | 2/2014 | Green | H02P 27/04 318/503 |
| 2014/0226369 A1* | 8/2014 | Kimura | H02M 3/3376 363/21.09 |
| 2014/0306638 A1 | 10/2014 | Wu et al. | |

\* cited by examiner

Fig. 3

|  0  |  1  |   |
| --- | --- | --- |
| x = 0 | y = 0 | A |
| 0 < x ≤ X1 | 0 < y ≤ Y1 | B |
| 0 < x ≤ X1 | y = 0 | C |
| X1 < x | Y1 < y | D |

METHOD AND DEVICE FOR DETECTING A CONTROL METHOD OF AN INVERTER

The present invention relates to a method and a device for detecting a control method of an inverter for supplying current to an electric machine, in particular a synchronous machine, having N phases.

A monitoring of an electric machine typical in practice is based on the fact that a target torque to be generated by the electric machine is compared with an actual torque generated by the electric machine. The actual torque is typically not directly measured but calculated from measurement variables. In order to monitor the correct operation of the inverter, it is required that these measurement values are not taken from a functional unit upstream of the inverter but from the inverter and downstream components thereof.

The actual torque M_ist can be determined by means of a calculation of the mechanical power output P_mech as M_ist=P_mech/(2πn) prevailing on the shaft of the electric machine, wherein n is the rotational speed of the electric machine. The mechanical power output P_mech is the difference between the electric power output, which can be calculated from the phase currents and phase voltages of the electric machine, and the power loss. The power loss consists of losses in the lines to the electric machine, losses in the electric machine, iron losses and frictional losses. The power loss is available as a parameter for the monitoring that is dependent on an operating point of the electric machine (for example established by means of the rotational speed and the torque) and was pulled out previously per application in the electric machine for exactly one control method.

The power loss can be directly determined in this way as long as said loss remains constant at an operating point. This however assumes that the electric machine is operated only with the exactly one control method. Other control methods namely cause a change in the power loss for an operating point possibly overlap in a working area extending over the rotational speed and the torque.

A correct determination of the power loss is not possible without knowledge of the control method of the electric machine and thus a reliable monitoring of the actual torque generated by the electric machine is also not possible.

SUMMARY OF THE INVENTION

The aim of the present invention consists of providing a method and a device for detecting a control method of an inverter for supplying current to an electric machine having N phases, which enables a correct determination of the power loss at low costs a without requiring additional input signals for the inverter.

A method for detecting a control method of an inverter for supplying current to an electric machine having N phases comprises the steps of sensing a control signal, which is fed to the inverter and which is clocked with a periodic cycle, over a specified number of periodic cycles of the control signal; determining a duty cycle frequency for the sensed control signal over the specified number of periodic cycles; and detecting the control method on the basis of the determined duty cycle frequency. The electric machine is particularly designed as a synchronous machine.

The term duty cycle frequency refers to a determined frequency with which a respective determined duty cycle, for example 0 or 1, occurs during the specified number of periodic cycles. The respective duty cycle can be specified by in each case exactly one value, for example 0 or 1, or by a respective value range, for example from 0.00 to 0.05 or from 0.95 to 1.00. The term duty cycle refers to the respective relationship between a time duration of a first level of the control signal during a respective periodic cycle and the time duration of the periodic cycle. In the case of a control signal which at first times can have a high level and at other times a low level, the first level preferably corresponds to the high level.

The method enables a correct determination of the power loss without additional input signals for the purpose of providing an item of information about the control method used having to be supplied. The costs for the implementation of the method can thus also be kept low.

In a modification, the method further includes that determining the duty cycle frequency comprises a determining of a frequency of a zero-duty cycle, i.e. a duty cycle of 0, and/or a frequency of a one-duty cycle, i.e. a duty cycle of 1, and that the control method is detected on the basis of the determined frequency of the zero-duty cycle and/or the determined frequency of the one-duty cycle. As a result, a detection of the control signal is enabled that is exact and easy to implement.

In an enhancement to the above modification, the method further includes that a respective specified frequency range of the zero-duty cycle and a respective specified frequency range of the one-duty cycle are associated with the control methods to be detected and that a control method is detected if the determined frequency of the zero-duty cycle lies in the frequency range of the zero-duty cycle associated with this control method and the determined frequency of the one-duty cycle lies in the frequency range of the one-duty cycle associated with this control method. This enables an even more exact and more reliable detection of the control method.

In a modification, the method further includes that the control method for a determined frequency of the zero-duty cycle equal to zero and preferably for a determined frequency of the one-duty cycle equal to zero is detected as a continuous control method, in particular space vector pulse width modulation (SVPWM), and otherwise is detected as a discontinuous control method. As a result, a simple and uncomplicated assignment of the control method is made possible.

In this case control methods are considered to be discontinuous control methods, in which the quasi-sinusoidal control voltage (or sine of the third harmonic) is abandoned, which is generated by the control signals. In a simple form of the discontinuity, for example for control methods such as overmodulation, single-zero-pointer and flattop, the control voltage is leveled at the highest and lowest point over a predetermined time or a predetermined angle. The frequency of a duty cycle of 0, i.e. the zero-duty cycle, and/or the frequency of a duty cycle of 1, i.e. a one-duty cycle, are higher for this discontinuous control method than for the continuous SVPWM control methods. In the single-zero-pointer control method, no one-duty cycles occur, whereas zero-duty cycles occur more frequently than in the SVPWM control method. In a distinct form of discontinuity, such as, for example, in the block operation control method, the control voltage goes over completely to a square wave signal, which results in an even higher frequency of the zero-duty cycle and the one-duty cycle.

In the continuous SVPWM control method, there is on the other hand only few moments where the duty cycle theoretically achieves 0 or 1. In the SVPWM control method, a duty cycle of 0 or 1 is, however, never achieved because in this method at least switch-on and switch-off times have to be maintained between consecutive PWM periodic cycles.

The above statements enable a more finely subdivided association and thus a more exact detection of the discontinuous control methods by means of the respective modifications that are explained in more detail below and can also be combined with one another.

In one of these modifications to the method, provision is made for the control method for a determined frequency of the zero-duty cycle to be greater than zero and smaller than or equal to a specified first limit value and for a determined frequency of the one-duty cycle greater than zero and smaller than or equal to a specified second limit value as an overmodulation control method or a flat top control method.

In another of these modifications to the invention, provision is made for the control method to be detected for a determined frequency of the zero-duty cycle greater than a specified first limit value and for a determined frequency of the one-duty cycle greater than a specified second limit value as a block operation control method.

In yet another of these modifications to the method, provision is made for the control method to be detected for a determined frequency of the zero-duty cycle greater than zero and smaller than a specified limit value and for a determined frequency of the one-duty cycle equal to zero as a single-zero-pointer control method.

In a combination of the above modifications, it is preferable that the limit value specified with regard to the zero-duty cycle is established as a single limit value for the detection of the different discontinuous control methods. In a combination of the above modifications, it is also furthermore preferable that the limit value specified with regard to the one-duty cycle is established as a single limit value for the detection of the different discontinuous control methods.

The above modifications thus enable a detection of the control method used, which is detailed, exact and easy to implement.

In a modification to the invention, the method includes that, when sensing the control signal, only components of the control signal for an upper half of the inverter designed as a full bridge or only components of the control signal for a lower half of the inverter designed as a full bridge are sensed; and, in fact, the control voltages for the electric machine are generated by means of the control signals at the IGBTs in the upper or lower half bridge of the inverted rectifier or respectively inverter, wherein the control signals of the upper half bridge are outputted during a simplified examination without regard to a protection time to be maintained in an inverted manner in the lower half bridge. This enables a cost effective implementation of the method.

Alternatively or additionally, the method according to the modification includes that the duty cycle frequency is determined as a consolidated duty cycle frequency over all of the N phase components of the control signal. In so doing, the frequency of the duty cycles of the N phases is sensed consequently as a whole and without association with the respective phases. This enables a cost effective implementation of the method.

The invention furthermore comprises a device for detecting a control method of an inverter for supplying current to an electric machine, having N phases, wherein the device is designed to sense a control signal, which is fed to the inverter and which is clocked with a periodic cycle, over a specified number of periodic cycles of the control signal, to determine a duty cycle frequency for the sensed control signal over the specified number of periodic cycles and to detect the control method on the basis of the determined duty cycle frequency. In advantageous modifications, the device is furthermore designed to carry out at least one of the modifications to the method explained above. According to the method, disclosed features also are to apply as disclosed according to the device and vice versa.

With this device and the modifications thereto, the same advantages as in the case of the previously explained method and the modifications thereto can be achieved.

In a preferable manner, one of the methods mentioned above of one the devices mentioned above is used in order to monitor a torque or respectively an actual torque of the electric machine and/or in order to estimate an operating-point-dependent power loss of the electric machine according to a control method detected by means of the method or the device. As a result, the actual torque of the electric machine can be correctly calculated and monitored in a particularly efficient manner.

BRIEF DESCRIPTION OF THE DRAWINGS

Exemplary embodiments of the invention without their limitation thereto are explained below with reference to the figures, in which identical or similar components are provided with the same reference signs for a plurality of figures.

The invention is explained below in detail with the aid of the drawings. In the drawings:

FIG. 3 shows a method for detecting the control method.

DETAILED DESCRIPTION

Figure 1:
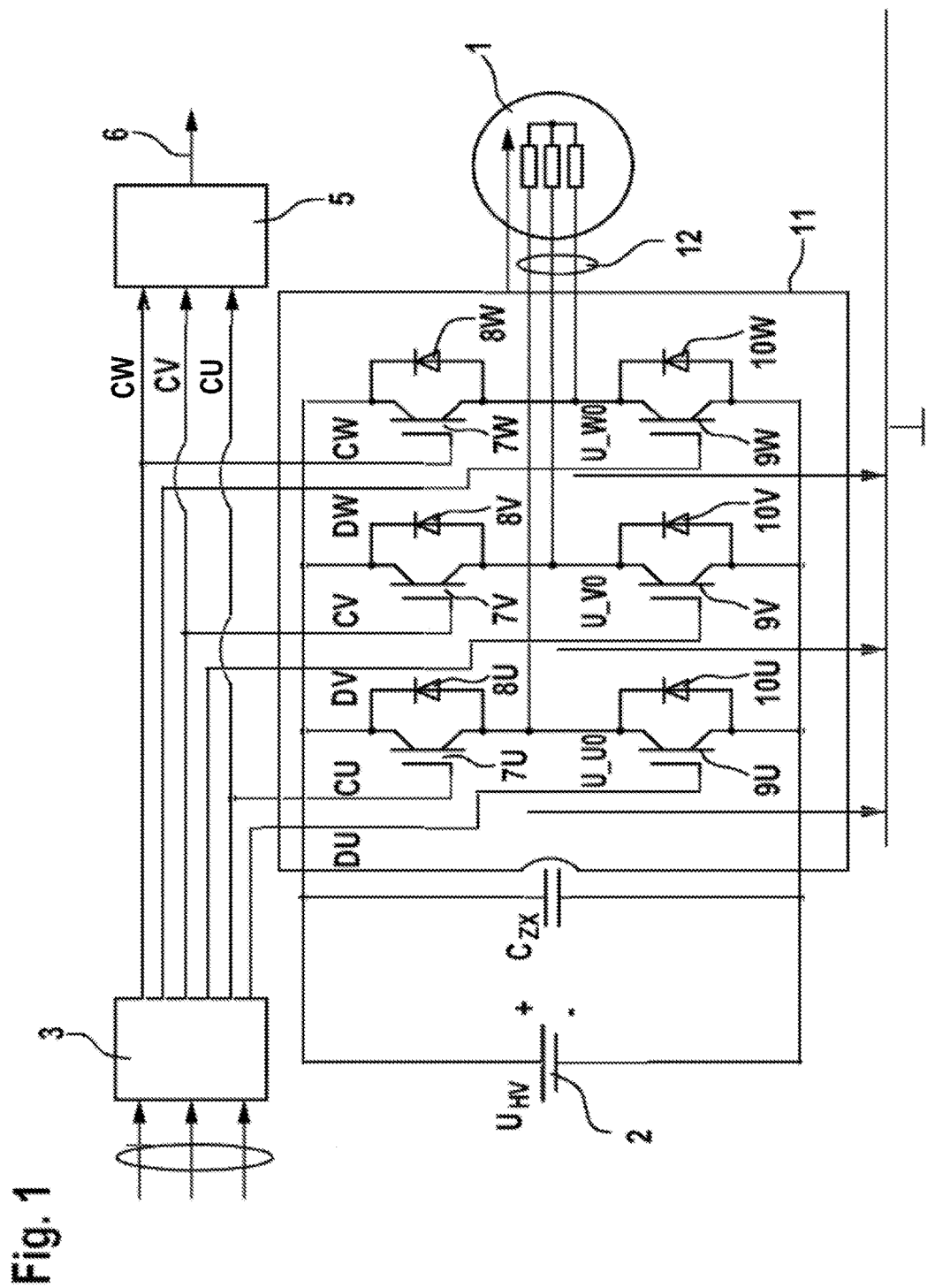
FIG. 1 shows a section of a system comprising an inverter for supplying current to an electric machine.

FIG. 1 illustrates a section of a system comprising an inverter 11 for supplying current to an electric machine 1, having N=3 phases U, V and W. The inverter 11 forms the direct current energy stored in a battery 2 in respective phase voltages $U_{13}$ U0, U_V0 and U_W0 in order to feed said direct current energy as AC voltages via phase lines 12 to the electric machine 1. The inverter 11 is designed as a full bridge with an upper and a lower half bridge. For each of the three phases of the inverter 11, the AC voltage fed to the electric machine 1 is generated by means of a series circuit consisting of a parallel circuit of an IGBT 7U, 7V or 7W associated with the upper half bridge and a diode 8U, 8V or 8W and a parallel circuit of an IGBT 9U, 9V or 9W associated with the lower half bridge and a diode 10U, 10V or 10W. A control unit or respectively driver circuit 3 fed with control signals provides the power inverter or respectively inverter 11 with control signals CU, CV, CW (for the upper half bridge) and DU, DV, DW (for the lower half bridge) in order to control the switching behavior of the IGBTs 7U, 7V, 7W of the upper half bridge or respectively 9U, 9V, 9W of the lower half bridge of the inverter 11.

A device for detecting the control method 5 is fed with the control signals CU, CV and CW for the upper half bridge of the inverter 11. The device 5 is designed to carry out one of the methods described above and detects the control method on the basis of the control signals CU, CV and CW fed via a specified number of periodic cycles. The device 5 provides an item of information 6 at the outlet thereof with regard to the control method detected by the device 5, the knowledge of which is used subsequently for a correct determination of the power loss or respectively to monitor the actual torque.

Figure 2:
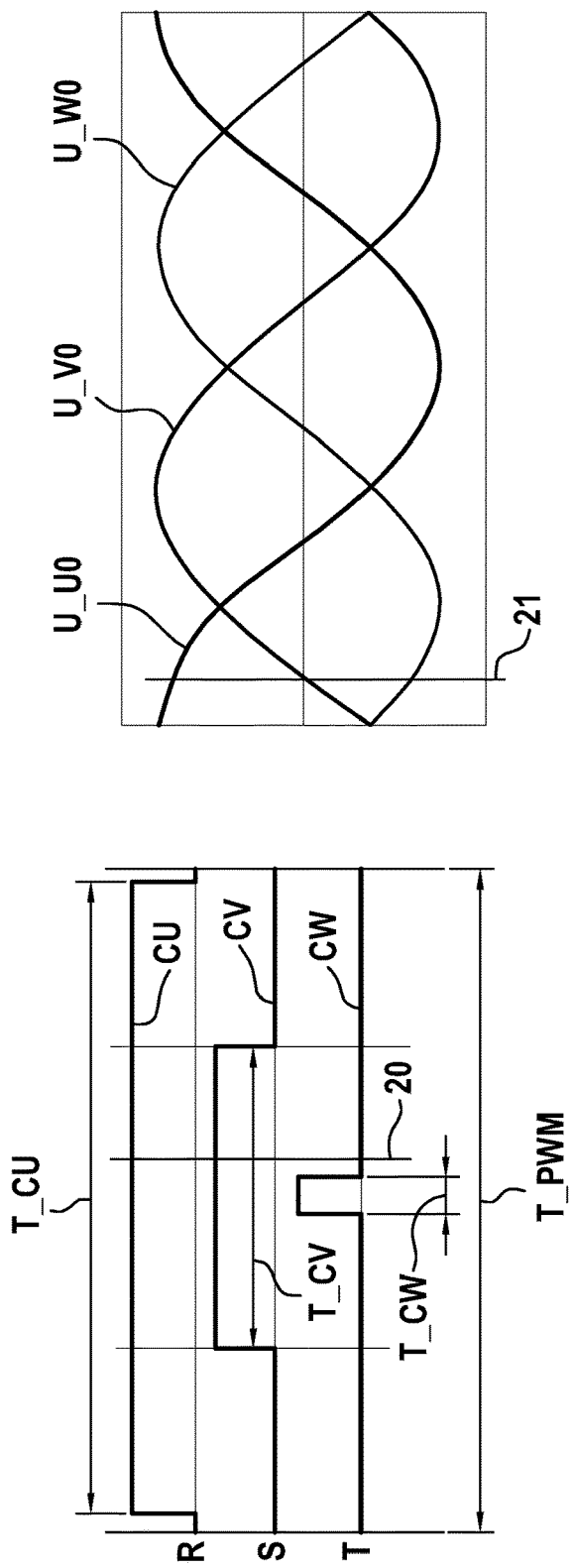
FIG. 2 shows an SVPWM control method for an inverter for a three-phase current supply.

FIG. 2 illustrates, using the example of a SVPWM control method for an inverter for a three-phase current supply of an electric machine, a relationship between control signals CU, CV and CW, which are depicted by way of example in the left half of FIG. 2 and the resulting control voltages U_U0, U_V0 and U_W0 for the electric machine 1, which is depicted by way of example in the right half of FIG. 2. The control voltages are for a periodic cycle, having a time duration T PWM and respective time durations of a high level T_CU, T_CV or T_CW. The vertical time axes 20 and 21 depict control levels or respectively control voltages belonging to the same point in time. In order to generate a maximum control voltage in a phase, the corresponding control signal has to output a maximum duty cycle. In order to output a minimum control voltage of a phase, the associated control signal must output a minimum duty cycle.

Figure 3:
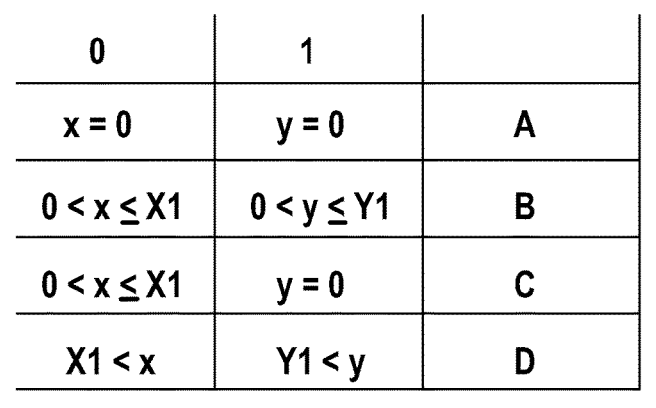

FIG. 3 illustrates a method for detecting the control method as a function of a determined frequency x of a zero-duty cycle (left column in FIG. 3) and a determined frequency y of a one-duty cycle (middle column in FIG. 3), wherein the frequencies were determined over a number of periodic cycles. If the frequency of the zero-duty cycle x is determined to be zero (x=0) and if the frequency of the one-duty cycle y likewise is determined to be zero (y=0), the SVPWM control method is then detected as the control method ("A" in the right column of FIG. 3). If the frequency of the zero-duty cycle x, on the other hand, is greater than zero and smaller than or equal to a first specified limit value X1 (where X1>0) and if the frequency of the of the one-duty cycle y is greater than zero and smaller than a second specified limit value Y1 (where Y1>0), the overmodulation control method or the flat top control method is detected ("B" in the right hand column of FIG. 3). If the frequency of the zero-duty cycle x is greater than zero and smaller than or equal to the first specified limit value X1 and if the frequency of the one-duty cycle y is equal to zero, the single-zero-pointer control method is detected as the control method ("C" in the right hand column of FIG. 3). If the frequency of the zero-duty cycle x exceeds the specified first limit value X1 and if the frequency of the one-duty cycle y exceeds the specified limit value Y1, the block operation control method is then detected as the control method ("D" in the right hand column of FIG. 3).

The invention claimed is:

1. A method for detecting a control method of an inverter (11) for supplying current to an electric machine (1) having N phases, comprising:
sensing a control signal (CU, DU, CV, DV, CW, DW), which is fed to the inverter and which is clocked with a periodic cycle, over a specified number of periodic cycles of the control signal;
determining a duty cycle frequency for the sensed control signal over the specified number of periodic cycles; and
detecting the control method on the basis of the determined duty cycle frequency.

2. The method according to claim 1, wherein determining the duty cycle frequency comprises determining a frequency of a zero-duty cycle, a frequency of a one-duty cycle, or both and detecting the control method is based on the frequency of the zero-duty cycle, the determined frequency of the one-duty cycle, or both.

3. The method according to claim 2, wherein a respective specified frequency range of the zero-duty cycle and a respective specified frequency range of the one-duty cycle are associated with control methods to be detected and that one control method is detected if the determined frequency of the zero-duty cycle lies in the frequency range of the zero-duty cycle associated with the one control method and the determined frequency of the one-duty cycle lies in the frequency range of the one-duty cycle associated with the one control method.

4. The method according to claim 2, wherein the control method is detected as a continuous control method for a determined frequency of the zero-duty cycle that equals zero and preferably for a determined frequency of the one-duty cycle that equals zero and is otherwise detected as a discontinuous control method.

5. The method according to claim 2, wherein the control method for a determined frequency of the zero-duty cycle greater than zero and smaller than or equal to a specified first limit value and for a determined frequency of the one-duty cycle greater than zero and smaller than or equal to a specified second limit value is detected as an overmodulation control method or a flat top control method.

6. The method according to claim 2, wherein the control method for a determined frequency of the zero-duty cycle greater than a specified first limit value and for a determined frequency of the one-duty cycle greater than a specified second limit value is detected as a block operation control method.

7. The method according to claim 2, wherein the control method for a determined frequency of the zero-duty cycle greater than zero and smaller than a specified limit value and for a determined frequency of the one-duty cycle equal to zero is detected as a single-zero-pointer control method.

8. The method according to claim 1, wherein, when sensing the control signal, only components of the control signal for an upper half of the inverter designed as a full bridge and only components of the control signal for a lower half of the inverter designed as a full bridge are sensed, that the duty cycle frequency is determined as a consolidated duty cycle frequency over all of the N phase components of the control signal, or both.

9. A device (5) for detecting a control method of an inverter (11) for supplying current to an electric machine (1) having N phases, wherein the device is designed to sense a control signal (CU, DU, CV, DV, CW, DW), which is fed to the inverter and which is clocked with a periodic cycle, over a specified number of periodic cycles of the control signal, for determining a duty cycle frequency for the sensed control signal over the specified number of periodic cycles and for detecting the control method on the basis of the determined duty cycle frequency.

10. An electric machine having N phases and comprising:
a device (5) for detecting a control method of an inverter (11) for supplying current to the electric machine (1), wherein the device is designed to sense a control signal (CU, DU, CV, DV, CW, DW), which is fed to the inverter and which is clocked with a periodic cycle, over a specified number of periodic cycles of the control signal, for determining a duty cycle frequency for the sensed control signal over the specified number of periodic cycles and for detecting the control method on the basis of the determined duty cycle frequency,
wherein an operating-point-dependent power loss of the electric machine is estimated according to the control method.

* * * * *